US009887737B2

(12) United States Patent
Jin

(10) Patent No.: US 9,887,737 B2
(45) Date of Patent: Feb. 6, 2018

(54) RADIO FREQUENCY SIGNAL FAULT SIGNATURE ISOLATION IN CABLE NETWORK ENVIRONMENTS

(71) Applicant: CISCO TECHNOLOGY, INC., San Jose, CA (US)

(72) Inventor: Hang Jin, Plano, TX (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 15/372,271

(22) Filed: Dec. 7, 2016

(65) Prior Publication Data
US 2017/0310361 A1 Oct. 26, 2017

Related U.S. Application Data

(60) Provisional application No. 62/327,159, filed on Apr. 25, 2016.

(51) Int. Cl.
H04B 3/14 (2006.01)
H04B 3/46 (2015.01)
H04L 12/24 (2006.01)
H04L 12/26 (2006.01)
H04L 27/26 (2006.01)
(Continued)

(52) U.S. Cl.
CPC .......... H04B 3/46 (2013.01); G01R 31/3181 (2013.01); H04B 3/142 (2013.01); H04B 3/493 (2015.01); H04L 27/2628 (2013.01); H04L 41/0659 (2013.01); H04L 43/16 (2013.01)

(58) Field of Classification Search
CPC .......... H04B 3/46; H04B 3/493; H04B 3/142; H04L 27/2628; H04L 41/0659; G01R 31/3181
See application file for complete search history.

(56) References Cited

U.S. PATENT DOCUMENTS 7,706,252 B2    4/2010  Catter et al.
7,895,632 B2    2/2011  Sadja et al.
8,526,485 B2    9/2013  Thompson et al.
(Continued)

OTHER PUBLICATIONS

U.S. Appl. No. 15/372,259, filed Dec. 7, 2016, entitled "Network Architecture for Predictive Services Management in Cable Network Environments," Inventor: Hang Jin.

(Continued)

Primary Examiner — Jaison Joseph
(74) Attorney, Agent, or Firm — Merchant & Gould P.C.

(57) ABSTRACT

An example method for radio frequency (RF) signal fault signature isolation in cable network environments is provided and includes searching in phase domain for an echo in a channel response characterizing a channel in a cable network, the channel facilitating communication of a multi-tone signal in the cable network; identifying a phase in which the echo is found; calculating a tap amplitude corresponding to the identified phase, the calculated tap amplitude being indicative of group delay in the channel; correcting for the group delay in the multi-tone signal, for example, by subtracting the calculated tap amplitude from the multi-tone signal; and identifying a fault signature when amplitude of the corrected signal is greater than a threshold and the identified fault signature triggers operational maintenance of the cable network.

20 Claims, 10 Drawing Sheets

(51) Int. Cl.
*H04B 3/493* (2015.01)
*G01R 31/3181* (2006.01)

(56) References Cited

U.S. PATENT DOCUMENTS

| | | | |
|---|---|---|---|
| 8,837,302 B2 | 9/2014 | Basile et al. | |
| 8,861,577 B2 | 10/2014 | Liv et al. | |
| 8,868,736 B2* | 10/2014 | Bowler | H04L 43/0823 |
| | | | 375/229 |
| 8,971,394 B2 | 3/2015 | Wolcott et al. | |
| 9,003,460 B2 | 4/2015 | Basile et al. | |
| 9,025,469 B2 | 5/2015 | Bowler et al. | |
| 9,042,236 B2* | 5/2015 | Bowler | H04L 41/0677 |
| | | | 370/242 |
| 9,136,943 B2* | 9/2015 | Thompson | H04B 10/0795 |
| 9,264,101 B2 | 2/2016 | Currivan et al. | |
| 2007/0059986 A1 | 3/2007 | Rockwell | |
| 2011/0243214 A1 | 10/2011 | Wolcott et al. | |
| 2013/0286852 A1 | 10/2013 | Bowler et al. | |
| 2014/0003478 A1* | 1/2014 | Liu | H04B 3/46 |
| | | | 375/224 |
| 2017/0310539 A1 | 10/2017 | Jin | |
| 2017/0310541 A1 | 10/2017 | Jin | |
| 2017/0310562 A1 | 10/2017 | Jin | |

OTHER PUBLICATIONS

U.S. Appl. No. 15/397,589, filed Jan. 3, 2017, entitled "Hybrid Fibre Coaxial Fault Locationing in Cable Network Environments," Inventor: Hang Jin.
U.S. Appl. No. 15/397,603 filed Jan. 3, 2017, entitled "Hybrid Fibre Coaxial Fault Classification in Cable Network Environments," Inventor: Hang Jin.
Extended EP Search Report dated Aug. 29, 2017 cited in Application No. 17167423.7, 12 pgs.
Extended EP Search Report dated Aug. 31, 2017 cited in Application No. 17167841.0, 11 pgs.

* cited by examiner

SET INITIAL VARIABLES AND CONSTANTS (e.g., jay=sqrt(-1); pi=4*atan(1));
SET SAMPLING RATE IN MHz;
SET SAMPLE DURATION IS us (e.g., 195 ns);
SET FFT SIZE (e.g., 64);
SET IFFT SIZE (e.g., 64);
SET SKIRT SIZE FOR WINDOWING (e.g., 4);
SET PRE-EQUALIZATION DELAY (e.g., INDICATIVE OF TAP INDEX);
SET LENGTH OF PRE-EQUALIZATION COEFFICIENTS;
SET SIGNAL SNR IN dB (e.g., 20);
SET FILTERING ALGORITHM FOR DERIVING CHANNEL RESPONSE (e.g., ZFE OR MMSE);
SET CHANNEL GAIN IN dB (e.g., 0);
SET ITERATION INTERNAL VARIABLES (e.g., NUMBER OF ITERATIONS, ARRAYS, ETC.);
ITERATE UNTIL DESIRED CONVERGENCE:
    CAPTURE SIGNAL;
    COMPUTE CHANNEL RESPONSE IN FREQUENCY DOMAIN USING PRE-EQUALIZATION COEFFICIENTS;
        CHANNEL RESPONSE INCLUDES EFFECTS OF DELAYS OF EACH TAP AND grp_delay;
    ADD WINDOWING TO REMOVE GIBBS PHENOMENON;
    ITERATE FOR EACH TAP:
        COMPUTE ARRAY OF POSSIBLE PHASE SHIFTS (e.g., grp_phs=exp(jay*2*pi*grp_comp*(0:fft_size-1)/fft_size));
        PHASE-SHIFT CHANNEL RESPONSE BY POSSIBLE PHASE SHIFTS (e.g., ch_f1=ch_f0.*grp_phs);
        APPLY IFFT TO PHASE SHIFTED CHANNEL RESPONSE (e.g., ch1=ifft(ch_f1,fft_size));
        FIND CORRELATION PEAK (e.g., [a,a_ind]=max(abs(ch1)));
        FIND PHASE IN WHICH CORRELATION PEAK IS FOUND (e.g., max_a=a; grp_comp0=grp_comp tap_ind0=a_ind; tap0=ch1(a_ind);
        ROTATE CHANNEL RESPONSE BY FOUND PHASE (e.g., exp(-jay*2*pi*(tap_ind0-1+grp_comp0)*(0:fft_size-1)/fft_size);
        COMPUTE TAP AMPLITUDE FROM DE-PHASED SIGNAL (e.g., ch_f_det=tap0*exp(-jay*2*pi*(tap_ind0-1+grp_comp0)*(0:fft_size-1)/fft_size));
        SUBTRACT TAP AMPLITUDE FROM SIGNAL (e.g., ch_f0=ch_f0-ch_f_det.');
    END ITERATION
END ITERATION
RETURN SIGNAL WITHOUT GROUP DELAY;
COMPARE SIGNAL WITHOUT GROUP DELAY AGAINST THRESHOLD;
IF GREATER THAN THRESHOLD, RETURN FAULT SIGNATURE

FIG. 12

RADIO FREQUENCY SIGNAL FAULT SIGNATURE ISOLATION IN CABLE NETWORK ENVIRONMENTS

CROSS-REFERENCE TO RELATED APPLICATION

This application claims the benefit of priority under 35 U.S.C. § 119(e) to U.S. Provisional Application Ser. No. 62/327,159, entitled "PREDICTIVE SERVICES MANAGEMENT IN CABLE NETWORKS," filed on Apr. 25, 2016, which is hereby incorporated by reference in its entirety.

TECHNICAL FIELD

This disclosure relates in general to the field of communications and, more particularly, to radio frequency (RF) signal fault signature isolation in cable network environments.

BACKGROUND

Consumer appetite for bandwidth continues to grow exponentially, challenging competition in the cable network market. Cable operators are constantly seeking ways to boost profits and free cash flow in part by lowering costs. Costs can be reduced in various ways, for example, by proactively responding to network problems using predictive solutions such as monitoring to relieve a problem before an outage occurs and by improving efficiencies in maintenance, for example by accurately deploying the right resources at the right time in the right place. Monitoring may be implemented in cable networks employing Data Over Cable Service Interface Specification (DOCSIS) standards for operation by using DOCSIS devices equipped with monitoring tools for plant monitoring purposes. By using these devices as network probes, cable operators can collect device and network parameters. Combining the analysis of the collected data along with network topology and device location from a geographical information system (GIS), it may be possible to isolate the source of any potential problem before they negatively impact operations. However, currently existing mechanisms for proactively responding to failures in cable networks are limited in various ways.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 12 is a simplified flow diagram illustrating other example operations that may be associated with embodiments of the communication system.

DETAILED DESCRIPTION OF EXAMPLE EMBODIMENTS

Overview

An example method for signal fault signature isolation in cable network environments is provided and includes searching in phase domain for an echo in a channel response characterizing a channel in a cable network, the channel facilitating communication of a multi-tone signal in the cable network; identifying a phase in which the echo is found; calculating a tap amplitude corresponding to the identified phase, the calculated tap amplitude being indicative of group delay in the channel; correcting for the group delay in the multi-tone signal, for example, by subtracting the calculated tap amplitude from the multi-tone signal; and identifying a fault signature when amplitude of the corrected signal is greater than a threshold and the identified fault signature triggers operational maintenance of the cable network.

As used herein, the term "channel response" comprises a mathematical characterization (e.g., model, simulation, quantitative estimation, etc.) of a communication channel (e.g., signal pathway for signals having one or more frequencies or a specific frequency allocation (e.g., in the RF spectrum)). In other words, the channel response models channel behavior (or effect of the channel) on a time-varying signal as it traverses the channel. It is typically a measure of amplitude and phase of the output signal (e.g., as a function of frequency) relative to the input signal.

Example Embodiments

Figure 1:
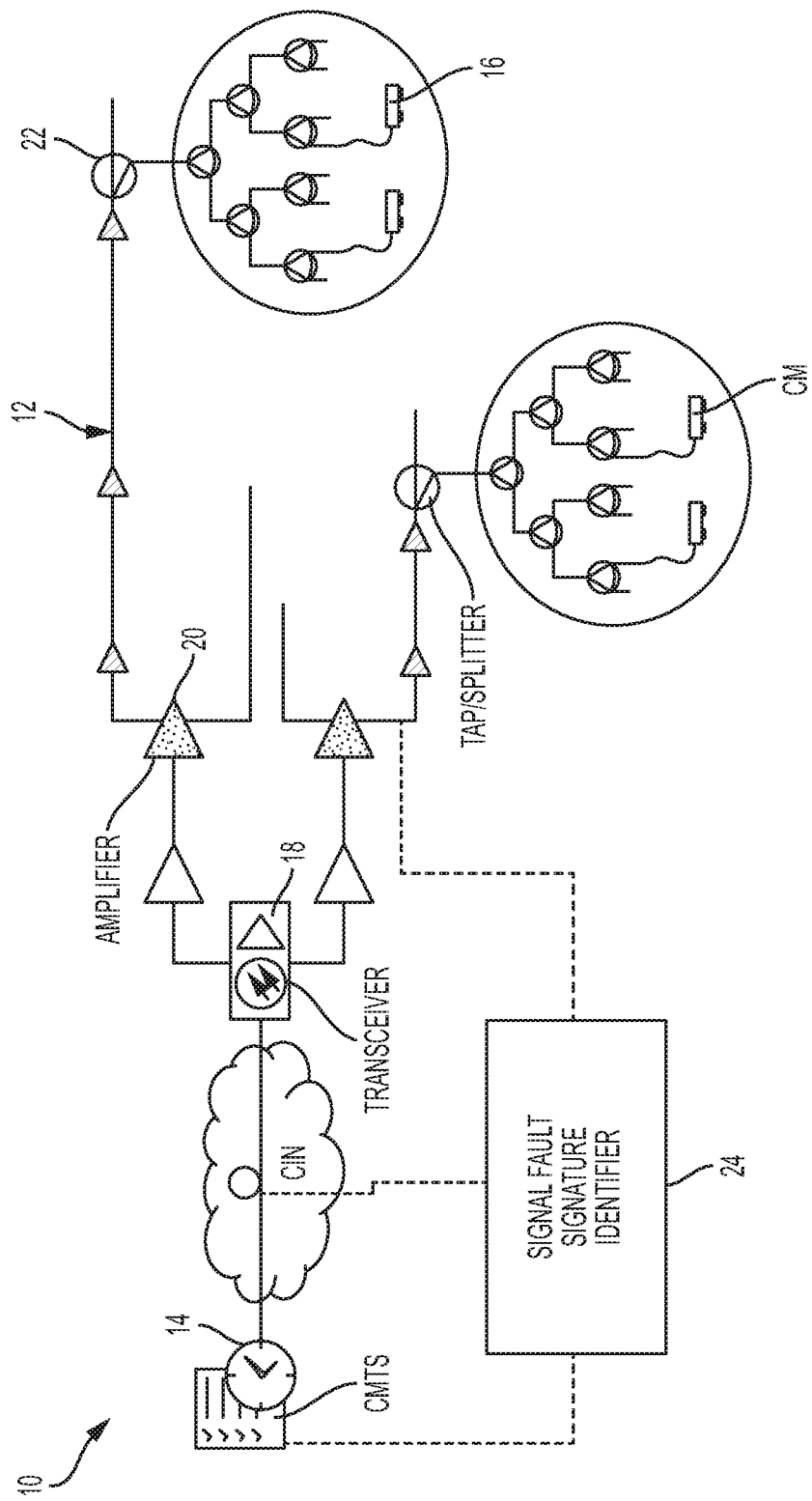
FIG. 1 is a simplified block diagram illustrating a communication system facilitating signal fault signature isolation in cable network environments.

Turning to FIG. 1, FIG. 1 is a simplified block diagram illustrating a communication system 10 for signal fault signature isolation in cable network environments in accordance with one example embodiment. FIG. 1 illustrates a cable network 12 (indicated generally by an arrow) facilitating communication between a cable modem termination system (CMTS) 14 and one or more DOCSIS terminal devices 16 such as cable modems (CMs). Note that in various embodiments, the terminal devices can comprise any one of modem terminal adapters, multimedia terminal adapters, VoIP terminal adapters, embedded cable modems of DOCSIS set-top gateways or like devices. Terminal devices 16 are connected to a headend (comprising one or more transceiver 18 and CMTS 14) of cable network 12 via nodes such as Hybrid-Fibre Coaxial (HFC) radio frequency (RF) amplifiers 20 and passive devices 22 including cabling, taps, splitters, and in-line equalizers. Cable network 12 includes various other components that are not shown in detail in the figure and facilitates communication of multi-tone signals between transceiver 18 and DOCSIS terminal devices, such as cable modems 16.

In some embodiments, CMTS 14 is geographically remote from transceiver 18 and connected thereto across a Converged Interconnect Network (CIN), which comprises an IP network facilitating communication according to certain specific DOCSIS (and other) protocols. The headend connects to an IP (Internet Protocol) and/or PSTN (Public Switched Telephone Network) network. Data, such as TV programs, audio, video and other data is sent from the headend to the terminal devices. In addition, terminal devices 16 send data upstream towards the headend. Each of the nodes may be connected to multiple terminal devices. In various embodiments, the nodes connect to the headend, and the headend contains a plurality of CMTS units. Each CMTS contains a plurality of transceivers, which communicate with the plurality of terminal devices. For example, each CMTS may have eight or more receivers, and each receiver may communicate with hundreds of terminal devices.

A signal fault signature identifier 24 is provisioned in one or more locations in communication system 10 to facilitate signal fault signature isolation in cable network 12. Signal fault signature identifier 24 can facilitate identifying network connectivity problems, including failed nodes, degraded nodes, loss of bandwidth, etc., in cable network 12 before they escalate to affect service. Signal fault signature identifier 24 uses pre-equalization coefficients as a metric to determine and identify faults in cable network 12. In one embodiment, signal fault signature identifier 24 identifies a fault signature, and the identified fault signature triggers further operational maintenance of cable network 12. For example, the identified fault signature triggers fault locationing and fault classification operations; in another example, the identified fault signature triggers a call to a field technician or network operator. In various embodiments, adverse effects of group delay are eased through algorithmic methods, for example, to improve accuracy of the signal fault signature identification.

In a general sense, HFC components, such as amplifiers 20, passive devices 22 and CMs 16 cause signal impairment in cable network 12 including by return loss, isolation, mixing, and combining. For instance, reflections (including micro-reflections) may be caused by a length of cable connecting two devices with poor return loss, acting as signal reflectors. Any HFC component has the potential to reflect signals. Typical CMs are configured for a design limit of 6 dB return loss whereas other components typically reflect a lower percentage of incident power.

To mitigate such signal losses, pre-equalization is generally implemented in cable network 12. For each channel of the signal (e.g., comprising data signals carried on a carrier of a particular frequency), an equalizer (comprising an electrical circuit) generates coefficients used in a digital equalizing filter that processes incoming signals with the coefficients for an inverse channel response, canceling distortions in the channel from the upstream channel impairments. In effect, the electrical circuit creates a digital filter that has approximately the opposite complex frequency response of the channel through which the signal is to be transmitted. DOCSIS 2.0 and DOCSIS 3.0 specify 24 symbol-spaced complex coefficients, also referred to as taps. The pre-equalization coefficients are used for amplitude and phase correction over a twenty-four symbol period time window.

Cable modems 16 typically implement pre-equalization to mitigate upstream channel impairments (e.g., for signals transmitted from CMs 16 towards CMTS 14). The upstream pre-equalization mechanism relies on interactions of DOCSIS ranging processes for determining and adjusting the pre-equalization coefficients. In various systems, CMTS 14 computes the pre-equalization coefficients for each of CMs 16, and provide them to the respective ones of CMs 16. Appropriate digital filters at CMs 16 use their respective pre-equalization coefficients to pre-distort upstream signals to compensate for known (e.g., expected and/or pre-measured) upstream path distortions (e.g., linear impairments), so that as the pre-distorted upstream signal travels through cable network 12 it is corrected and arrives free of distortion at CMTS 14.

To facilitate efficient and proactive maintenance of cable network 12, a predictive service management (PSM) approach is implemented in communication system 10. PSM is designed to automatically identify impending and current network defects that may have a service-affecting impact on one or more of the customers being served by the network. PSM can also be used to identify any corrective actions to be performed to prevent or correct those problems and/or to eliminate/minimize their impact on customer services. PSM further enables authorized users to obtain a deeper understanding of network behavior on a granular level, for example, to a single serving group and even to an individual customer. PSM can provide intelligence and massive data interpretation capabilities, thereby pinpointing the source(s) of network problems and providing recommended actions to correct the problem(s). On a technical level, PSM can be capable of managing tens of terabytes of historical network device operating information, while simultaneously providing real-time inquiry and access to the most recent information from network devices and customer premises equipment (CPE), such as cable modems.

In a general sense, each type of terminal device 16 has individual characteristics, as do specific impairments in cable network 12. Upstream signals from terminal device 16 towards CMTS 14 are unique to the different terminal devices, and constitute respective signatures. By analyzing these signatures, PSM algorithms can identify network problems. Moreover, analyzing upstream signatures can indicate problems with downstream transmission as well, because many of the upstream network defects are also downstream network defects, such as animals chewing on wires, cracks in the cable, amplifier malfunction, etc. In various embodiments, the PSM algorithms use pre-equalization coefficients from upstream signal signatures for fault detection. The pre-equalization coefficients can be retrieved in real time from the signals, or they can be stored in databases for subsequent evaluation. Either way, the pre-equalization coefficients will enable an operator to watch impairments before they impact network service.

CableLabs® Proactive Network Maintenance (PNM) systems discloses a method for fault identification and isolation using pre-equalization coefficients. According to PVM, CMs and CMTSs are polled to obtain pre-equalization coefficient data from all configured upstream channels. The gathered data is verified for format integrity and is normalized to be useful for comparison. For scalability purposes, the data collection process is conducted using a more frequent polling cycle for CMs that exhibited apparent distortion above a pre-determined level and a less frequent cycle for other CMs. The distortion is determined based on non-main tap to total energy (NMTER) ratio. A detailed analysis is conducted including calibration and determination of distortion signatures from frequency domain and time domain analysis.

With pre equalization coefficients, the approximate distance between two reflection points can be determined. Each one of the taps of the pre-equalization coefficients represents energy in the signal during a period of time. Taps of the pre-equalization coefficients that indicate more energy represent a reflection point. In other words, each of the taps relates to a time period based on the symbol rate of the channel. When a tap is elevated in power level amplitude, it indicates an impedance mismatch at that time period. Thus, comparing the tap energy of the signal with an expected value of the tap energy indicates an anomaly in the signal, possibly caused by a fault. The separation of the faulty tap from the main tap in time domain indicates a corresponding distance of the reflection point.

However, the distortion signatures detected by PNM include group delay and micro-reflections. In other words, PNM does not isolate or remove the effect of group delay for distortion signature determination. However, group delay can smear and smooth taps, making it difficult to isolate relevant (e.g., distinctive) taps indicative of faults in the network. Therefore, the PNM technique is not sufficiently accurate to detect faults in the presence of significant group delay.

Group delay is the negative derivative of radian phase with respect to radian frequency (according to the Institute of Electrical and Electronics Engineers (IEEE) Standard Dictionary of Electrical and Electronics Terms). Group delay is expressed mathematically as:

$$GD = -\frac{d\varphi}{d\omega}$$

where GD is group delay in seconds, $\varphi$ is phase in radians and $\omega$ is frequency in radians per second. Group delay is a measure of different frequencies traveling through the same medium at different speeds. If phase-versus-frequency response does not change in proportion to frequency, group delay exists. In a network with no group delay variation or group delay distortion, all frequencies are transmitted through the network in the same amount of time—that is, with equal time delay. If group delay distortion exists, signals at some frequencies travel faster than signals at other frequencies. Common sources of group delay in a cable network 12 include: power coils. diplex filters, band edges and rolloff areas, high-pass filters, data-only filters, step attenuators, in-line equalizers with filters, impedance mismatch-related micro reflections, etc.

Group delay can affect fault signature identification in algorithms that use pre-equalization coefficients for detecting faults. A −25 dB tap is generally not detectable in the presence of group delay because side taps can swamp close-in echoes with levels up to −10 dB. Thus, group delay can lead to faulty tap detection or poor accuracy of tap locations (in time). Unlike PNM, signal fault signature identifier 24, in various embodiments implementing PSM, identifies a fault signature from captured signals in cable network 12 using phase domain analysis (rather than, or in addition to, frequency domain and/or time domain analysis) and compensation for group delay.

For purposes of description, the term "fault signature" comprises an observation of a performance metric that is out of its expected value or range. There can be two aspects in such expected value or range: (1) an absolute threshold: for example, a signal is deemed not norm if its signal level is below 40 dBmV, or micro-reflections in the pre-equalization coefficients are −25 dB or above with respect to the main tap; and (2) a relative threshold: for example, the observations are examined for consistence, which may be specified with respect to time, frequency, and/or peer (group of CMs). Time consistence may be indicated, for example, if a signal level varies by xdB within N seconds (ms to ms). Frequency consistence may be indicated, for example, if the signal level varies by ydB over a [short] frequency spectrum. Peer consistence may be indicated, for example, if the signal level is zdB below its neighboring CMs'.

In various embodiments, signal fault signature identifier 24 provides improvements over existing signal fault identification technologies in cable networks by deriving a channel response from pre-equalization coefficients using known techniques, such as reverse minimum mean squared error (MMSE) or zero forcing (ZF) equalization algorithms, then starting with the main tap (e.g., tap index 8) of the channel response, searching for an echo (tap) in the phase domain for the selected tap in the channel response, finding a specific phase with the echo (e.g., corresponding to a correlation peak), dephasing the channel response, for example, by rotating the channel response with the specific phase, computing a tap amplitude from the dephased channel response, and subtracting the computed tap amplitude from the channel response, thereby removing the effects of group delay. The operations continue to the next tap location. Signal fault signature identifier 24 can detect distinctive taps after the effect of group delay is removed; the detection can be performed reliably with magnitude of −25 dB below the main tap and 20 ns accuracy, or approximately 10 ft of cable length, thereby providing better accuracy than currently existing techniques such as PNM.

Turning to channel response, assume H(t,τ) is the channel output at time t to an impulse applied at time t−τ, τ representing channel delay. In general, the output r(t) to an input signal s(t) for a linear time variant (LTV) channel is given as:

$$r(t)=\int_{-\infty}^{\infty}s(t-\tau)H(t,\tau)d\tau$$

In a general sense, the channel response simulates (e.g., models, estimates, approximates) errors introduced into the input signal s(t) by the channel. In embodiments of communication system 10, the derived channel response using the pre-equalization coefficients includes substantially all errors in the channel, including group delay. In various embodiments, signal fault signature identifier 24 includes algorithms for removing the effect of group delay from the estimated channel response (e.g., thereby accounting for group delay in the received signal; estimating contribution of group delay to the received signal; etc.) using phase domain analysis.

Turning to the infrastructure of communication system 10, the network topology can include any number of cable modems, customer premises equipment, servers, switches (including distributed virtual switches), routers, amplifiers, taps, splitters, combiners and other nodes inter-connected to form a large and complex network. Network 12 represents a series of points or nodes of interconnected communication pathways for receiving and transmitting packets and/or frames of information that are delivered to communication system 10. Note that cable network 12 may also be referred to as a cable plant, and/or HFC network. A node may be any electronic device, computer, printer, hard disk drive, client, server, peer, service, application, or other object capable of sending, receiving, amplifying, splitting, or forwarding signals over communications channels in a network. Elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs.

Cable network 12 offers a communicative interface between cable network components, and may include any appropriate architecture or system that facilitates communications in a network environment according to DOCSIS protocols and any other suitable communication protocol for transmitting and receiving data packets within communication system 10. The architecture of the present disclosure may include a configuration capable of DOCSIS, TCP/IP, TDMA, and/or other communications for the electronic transmission or reception of signals in the networks including cable network 12. The architecture of the present disclosure may also operate in conjunction with any suitable protocol, where appropriate and based on particular needs. In addition, gateways, routers, switches, and any other suitable nodes (physical or virtual) may be used to facilitate electronic communication between various nodes in the network.

In some embodiments, a communication link may represent any electronic link supporting a network environment such as, for example, cable, Ethernet, wireless technologies (e.g., IEEE 802.11x), ATM, fiber optics, etc. or any suitable combination thereof. In other embodiments, communication links may represent a remote connection through any appropriate medium (e.g., digital subscriber lines (DSL), coaxial fiber, telephone lines, T1 lines, T3 lines, wireless, satellite, fiber optics, cable, Ethernet, etc. or any combination thereof) and/or through any additional networks such as a wide area networks (e.g., the Internet).

Note that the numerical and letter designations assigned to the elements of FIG. 1 do not connote any type of hierarchy; the designations are arbitrary and have been used for purposes of teaching only. Such designations should not be construed in any way to limit their capabilities, functionalities, or applications in the potential environments that may benefit from the features of communication system 10. It should be understood that communication system 10 shown in FIG. 1 is simplified for ease of illustration.

In particular embodiments, CMTS 14 may comprise a hardware appliance with appropriate ports, processors, memory elements, interfaces, and other electrical and electronic components that facilitate the functions described herein, including providing high speed data services, such as cable Internet or voice over Internet Protocol (e.g., in the form of digital, RF, or other suitable signals) to cable subscribers, such as cable modems 16. In various embodiments, CMTS 14 comprises a Universal Broadband Router (uBR) with features that enable it to communicate with the HFC cable network via a suitable cable modem card, which provides an interface between the uBR protocol control information (PCI) bus and RF signals on the DOCSIS HFC cable network.

In some embodiments, CMTS 14 may comprise a converged cable access platform (CCAP) core that transmits and receives digital signals in IP protocols, coupled with one or more physical interface (PHY) transceiver(s), such as transceiver 18 that convert the digital IP signals into RF signals, and vice versa. The PHY transceivers, such as transceiver 18, may be co-located with the CCAP core at a common location, or may be located remote from the CCAP core and connected over a converged interconnect network (CIN). In some embodiments, CMTS 14 may comprise a single CCAP core and a plurality of PHY transceivers, such as transceiver 18. CMTS 14 is connected (e.g., communicatively coupled, for example, through wired communication channels) to cable modems 16, transceiver 18, and other network elements in cable network 12.

Transceivers 18 may comprise suitable hardware components and interfaces for facilitating the operations described herein. In some embodiments, transceivers 18 may be embedded in or be part of another hardware component, such as a broadband processing engine comprising a motherboard, microprocessors and other hardware components. In some embodiments, transceivers 18 comprise downstream and upstream PHY modules, deployed in a Coaxial Media Converter (CMC) that supports RF functions at the PHY layer. Transceivers 18 may comprise pluggable modules (e.g., small form-factor pluggable (SFP)) that may be plugged into a network element chassis, or embedded modules that attach to cables directly. In addition to optical and electrical interfaces, transceivers 18 include a PHY chip, appropriate digital signal processors (DSPs) and application specific integrated circuits (ASICs) according to particular needs.

Amplifiers 20 comprise RF amplifiers suitable for use in cable network 12. Amplifiers 20 are typically used at intervals in network 12 to overcome cable attenuation and passive losses of electrical signals caused by various factors (e.g., splitting or tapping the coaxial cable). Amplifiers 20 may include trunk amplifiers, distribution amplifiers, line extenders, house amplifier and any other suitable type of amplifier used in cable networks.

In various embodiments, signal fault signature identifier 24 comprises electrical circuits fabricated on integrated circuits (e.g., digital signal processors (DSPs), field programmable gate arrays (FPGAs), application specific integrated circuit (ASICs)), printed circuit boards, or other suitable platforms with appropriate transistors, conductors, resistors and other electrical components for facilitating various operations as described herein. In some embodiments, signal fault signature identifier 24 is incorporated into CMTS 14; in some other embodiments, signal fault signature identifier 24 is incorporated into a computing device, such as a server connected to cable network 12; in yet other embodiments, signal fault signature identifier 24 comprises a stand-alone dedicated device, for example, usable by a cable technician in the field.

Figure 2:
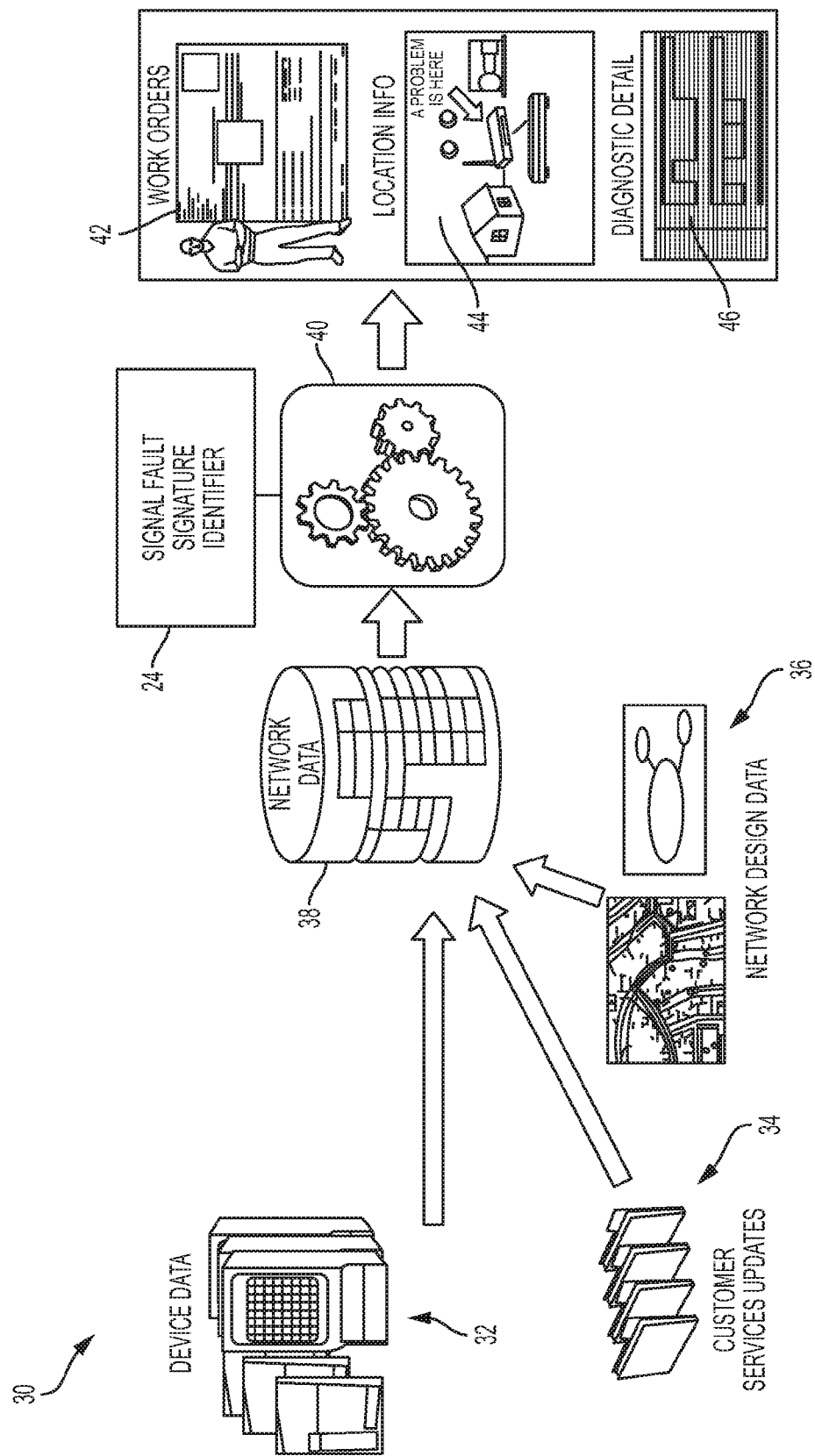
FIG. 2 is a simplified block diagram illustrating other example details of embodiments of the communication system.

Turning to FIG. 2, FIG. 2 is a simplified diagram illustrating example details of PSM 30 according to an embodiment of communication system 10. Device data 32, customer services updates 34, network design data 36 (and other data not shown in the figure) are collected and stored as network data 38. PSM algorithms 40 including those comprised in signal fault signature identifier 24 execute on network data 38 to troubleshoot cable network 12 and determine causative problems therein. Work orders 42, fault location information 44 and diagnostic details 46 are generated based on the results from algorithms 40. A key aspect of PSM 30 is detecting pending network problems before they negatively affect customers. Note that PSM 30 is implemented and executes external to the control plane and data plane of cable network 12. It is a supportive platform intended to advice network operators and field technicians on faults in cable network 12 and potential resolutions thereto.

Figure 3:
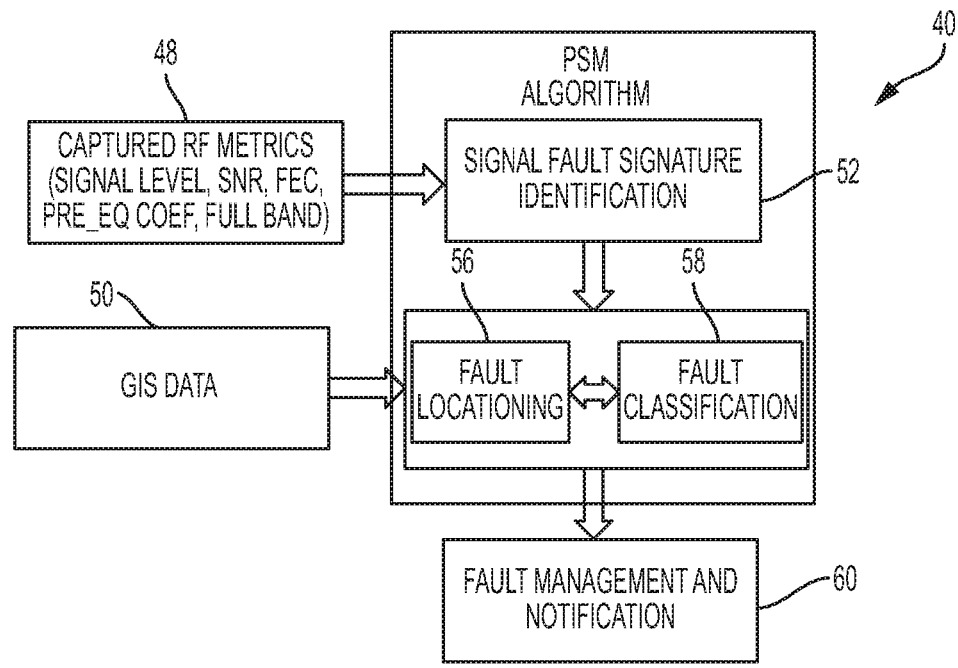
FIG. 3 is a simplified block diagram illustrating yet other example details of embodiments of the communication system.

Turning to FIG. 3, FIG. 3 is a simplified diagram illustrating example details of PSM algorithms 40 according to an embodiment of communication system 10. Captured RF metrics of cable network 12, including signal levels, signal-to-noise-ratio (SNR), forward error correction (FEC), pre-equalization coefficients, full band, etc., are provided to PSM algorithm 40. Additionally, geographical information system (GIS) data 50 from GIS databases (e.g., storing geospatial data (e.g., data defined spatially (in location) by four dimensions (geometry (e.g., latitude, longitude, depth) and time) related to the Earth), network information and GPS maps for various uses) is fed to PSM algorithm 40. In some embodiments, monitoring and signal leakage information in cable network 12 are collected and linked in the GIS database to tie together relevant network information, trouble, leakage, weather events, traffic congestion, etc. For example, power supplies, optical nodes, amplifiers and other active devices with a DOCSIS based transponder provide performance data back to the CMTS 14. The transponder uses DOCSIS standards for fiber node and power supply monitoring. Automatic signal leakage detection captures radio frequency leakage outbreaks and records with a time/date stamp and GPS location and sends the captured data back to the central GIS database.

Signal fault signature identification algorithm 52 uses captured RF metrics 48 to identify one or more faults in cable network 12. For example, signal fault signature identification 52 outputs that a fault is located 10 ft from the vicinity of a specific data collector device (e.g., test meter). Fault locationing algorithm 56 uses GIS data 50 to correlate the identified fault with a fault location (e.g., based on signal timing and other considerations). For example, fault locationing algorithm 56 identifies twenty specific devices in the 10 ft zone that could be potential fault generators. A fault classification algorithm 58 provides additional troubleshooting capabilities by specifying possible fault types associated with the fault signature in the fault location output by fault locationing algorithm 56. For example, fault classification algorithm 58 indicates that the fault signature is associated with an amplifier rather than a passive tap/splitter or a cable, thereby narrowing the fault generator choices to two or three devices. A fault management and notification algorithm 60 notifies a network operator about the problem; in some embodiments, fault management and notification algorithm 60 facilitates deploying a field technician to the affected device location to repair the fault before it is a problem for customers.

Figure 4:
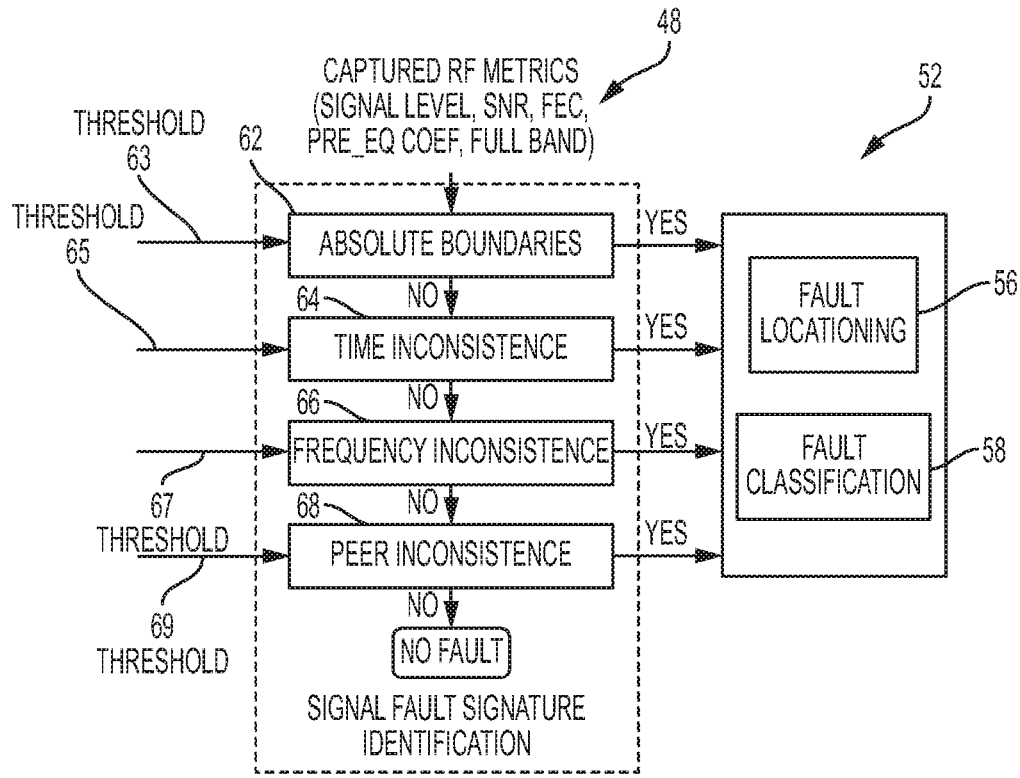
FIG. 4 is a simplified block diagram illustrating yet other example details of embodiments of the communication system.

Turning to FIG. 4, FIG. 4 is a simplified diagram illustrating example details of signal fault signature identification algorithm 52 according to an embodiment of communication system 10. Captured RF metrics 48 are provided as input to signal fault signature identification algorithm 52. An absolute boundaries module 62 checks captured RF metrics 48 against one or more relevant absolute threshold 63. For example, SNR may be checked against an SNR threshold. If the checked metric violates threshold 63, a fault is indicated and fault locationing algorithm 56 and fault classification algorithm 58 may be invoked.

If absolute boundaries module 62 does not detect a fault, a time inconsistence module 64 may compare captured RF metrics 48 against one or more relevant relative time threshold 65. For example, if expected synchronicity of signals is not met, the finding may indicate a fault; in other words, if cable modem A at a distance of X ft from a testing station can send a signal in m seconds; and another cable modem B at the same distance X ft from the testing station takes longer than m seconds to send the signal, a fault may be indicated between cable modem B and the testing station. If a fault is indicated, fault locationing algorithm 56 and fault classification algorithm 58 may be invoked.

If time inconsistence module 64 does not detect a fault, a frequency inconsistence module 66 may compare captured RF metrics 48 against one or more relevant relative frequency threshold 67. For example, if the expected frequency of a signal is x, and its measured frequency is y, a fault is indicated. If a fault is indicated, fault locationing algorithm 56 and fault classification algorithm 58 may be invoked.

If frequency inconsistence module 66 does not detect a fault, a peer inconsistence module 66 may compare captured RF metrics 48 against one or more relevant relative peer threshold 69. For example, if two cable modems are unexpected to send signals within x seconds of each other, a finding of a difference from the expected peer threshold may indicate a fault. If a fault is indicated, fault locationing algorithm 56 and fault classification algorithm 58 may be invoked.

Figure 5:
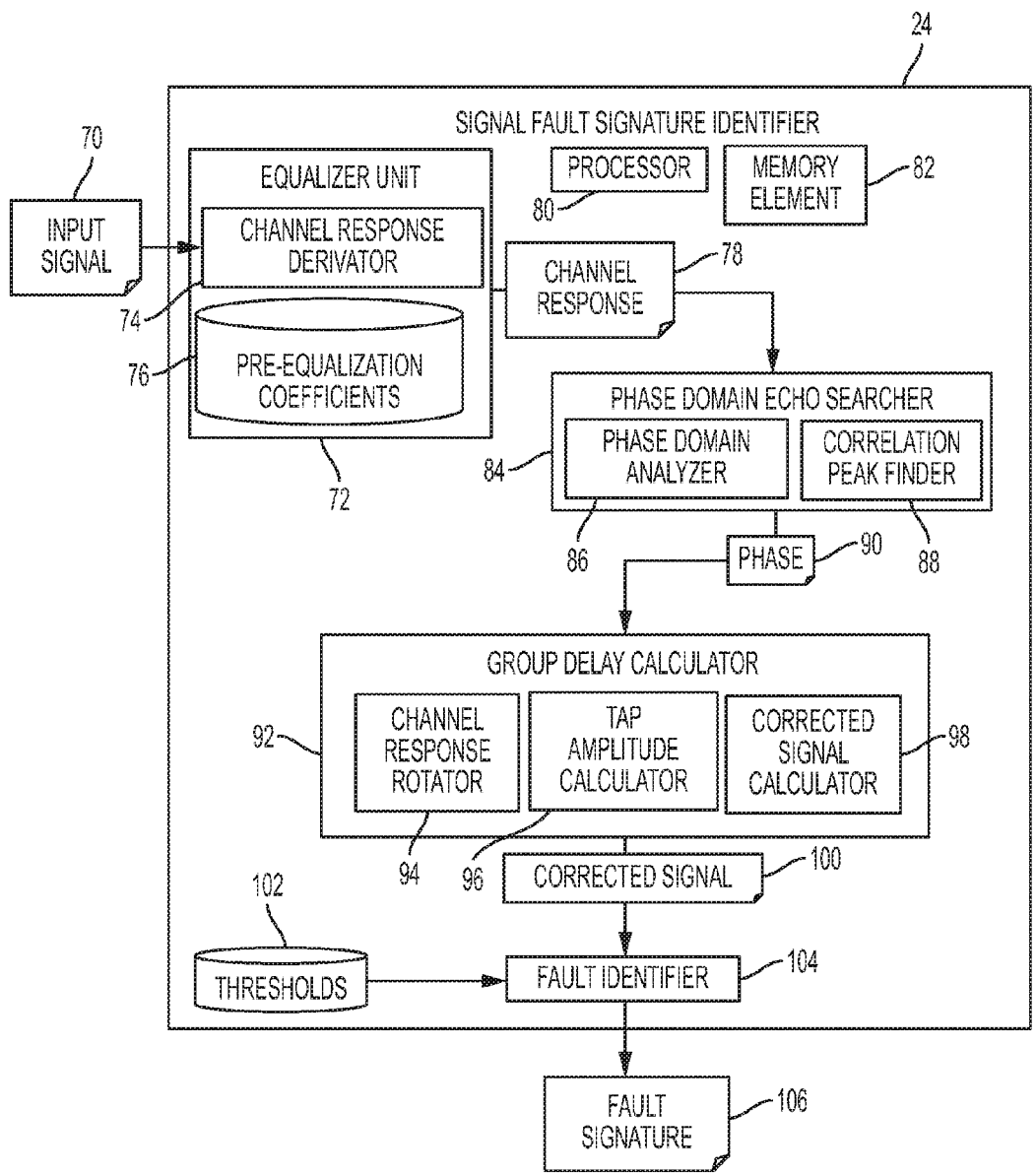
FIG. 5 is a simplified block diagram illustrating yet other example details of embodiments of the communication system.

Turning to FIG. 5, FIG. 5 is a simplified diagram illustrating example details of signal fault signature identifier 24 according to an embodiment of communication system 10. Signal fault signature identifier 24 receives a multi-tone signal 70 from cable network 12. In an example embodiment, multi-tone input signal 70 comprises data (e.g., comprising digital electrical pulses) carried over electromagnetic waves of discrete frequencies (e.g., carrier waves). In an example embodiment, input signal 70 comprises electromagnetic signals having multiple frequencies in the radio frequency spectrum carried in a tangible medium, such as optical fiber or electrical wire. In another example embodiment, wherein signal fault signature identifier 24 is used in oil pipeline networks, input signal 70 comprises audio waves carried in pipes (e.g., metal pipes, concrete pipes, etc.). An equalizer unit 72 receives signal 70.

In some embodiments, signal 70 comprises pre-equalization coefficients and downstream full spectrum capture. Terminal devices 16 may report their respective pre-equalization coefficients and provide the full spectrum capture when queried by signal fault signature identifier 24. In some embodiments, pre-equalization coefficients are obtained from DOCSIS MIBs and stored at signal fault signature identifier 24 before signal 70 is received. The pre-equalization coefficients are obtained, in one embodiment, by periodic polling of cable network 12 and stored suitably (e.g., in a database, table, array, etc.). In some embodiments, pre-equalization coefficients may be provided through captured RF metrics 48.

Equalizer unit 72 includes a channel response derivator 74 and a storage (e.g., database, table, etc.) of stored pre-equalization coefficients 76. In a general sense, an equalization system calculates and applies an inverse filter to a signal that removes distortions to the signal. Equalization estimates the inverse $H_e(f)$ of a channel response $H_c(f)$ and applies it to an incoming signal $s(t)$. Mathematically, the equalization transfer function can be expressed as:

$$H_e(f) = \frac{1}{H_c(f)} = \frac{1}{|H_c(f)|} e^{-j\theta(f)}$$

where $\theta(f)$ is the phase of the channel response, $j=\sqrt{-1}$ and $H_e(f)$ is a function of pre-equalization coefficients. In reverse, knowing the pre-equalization coefficients, $H_e(f)$ can be derived, the inverse of which provides the channel response $H_c(f)$.

One computationally efficient method of forming an inverse filter is the zero-forcing technique, using a zero forcing equalizer (ZFE). In ZFE, the combination of channel and equalizer gives a flat frequency response and linear phase. Another known technique for equalization is by using an MMSE equalizer, which minimizes the mean square error (MSE) in the received signal. The MMSE equalizer adapts the pre-equalization coefficients of the filter to minimize the mean-square error due to noise, interference and intersymbol interference (ISI). The adaptation of the MMSE equalizer is driven by an error signal which indicates to the equalizer the direction that the coefficients should be moved for better accuracy.

If the pre-equalization coefficients are known apriori, channel response 78 can be derived from inverse calculations of the equalization filter, for example, by the inverse of the ZFE or MMSE equalizer. Pre-equalization coefficients 76 comprises twenty-four taps; the main tap (tap index 8) is indicative of the channel without any impairments; in other words, the input signal 70 is perfectly replicated at the output of the channel. Additional taps are indicative of channel impairments. In various embodiments, channel response derivator 74 derives channel response 78 using pre-equalization coefficients 76. Signal fault signature identifier 24 includes a processor 80 and a memory element 82 for facilitating the operations described herein.

Channel response 78 is fed to a phase domain echo searcher 84, comprising a phase domain analyzer 86 and a correlation peak finder 88. Phase domain analyzer 86 analyzes channel response 78 in the phase domain. Phase domain analysis uses phase domain signals (r, θ) rather than classical Cartesian quadrature components (I, Q) for analysis. The phase of channel response 78 comprises the argument of the complex tap values. The impulse response (which is the channel response for an impulse input signal) appears randomized between $-\pi$ and $\pi$, except for the main tap, whose phase correction is 0 radians. In various embodiments, calculation of phase is based on FFT of the pre-equalization coefficients. The phase response, as a function of frequency and the FFT analysis, can be indicated as:

$$\theta(f) = \arg\left[h(t) \overset{FFT}{\longleftrightarrow} H(f)\right]$$

where H(f) is the equalization transfer function (which is the inverse of the channel response) and h(t) is the equalizer's impulse response.

In an example embodiment, an array of possible phase shifts is estimated and channel response 78 is phase-shifted according to the estimated array. Correlation peak finder 88 determines whether a peak is found, and the specific phase in which the peak occurs. In a general sense, cross-correlation is a measure of similarity of two series as a function of the lag of one relative to the other. It is commonly used for searching a long signal for a shorter, known feature, such as a peak. Cross-correlation is similar in nature to convolution of two functions. In various embodiments, IFFT is applied to the phase-shifted channel response 78 and a correlation peak determined by comparing the phase-shifted channel response with original (i.e., non-phase-shifted) channel response 78.

Phase 90 corresponding to the found peak is determined and provided to group delay calculator 92. A channel response rotator 94 therein rotates channel response 78 with phase 90, and dephased channel response is calculated. A tap amplitude calculator 96 computes the tap indicative of group delay from the de-phased channel response. A corrected signal calculator 98 calculates corrected signal 100, comprising channel response 78 from which the calculated tap amplitude is subtracted. A fault identifier 104 compares corrected signal 100 to thresholds 102 to determine if any unexpected taps are present in signal 70. The operations are continued for each tap of channel response 78. A fault signature 106 is output if a fault is found. Fault signature 106 comprises an observation of a performance metric, for example, one or more taps, that is out of its expected value or range, for example, a threshold for that tap. In an example embodiment, fault signature 106 comprises a tap index (e.g., third tap from the main tap; $5^{th}$ tap from the main tap; etc.); in another example embodiment, fault signature 106 comprises a time index (e.g., 10 μs from meter. Note that any suitable metric indicative of faults in cable network may be provided in fault signature 106.

Figure 6:
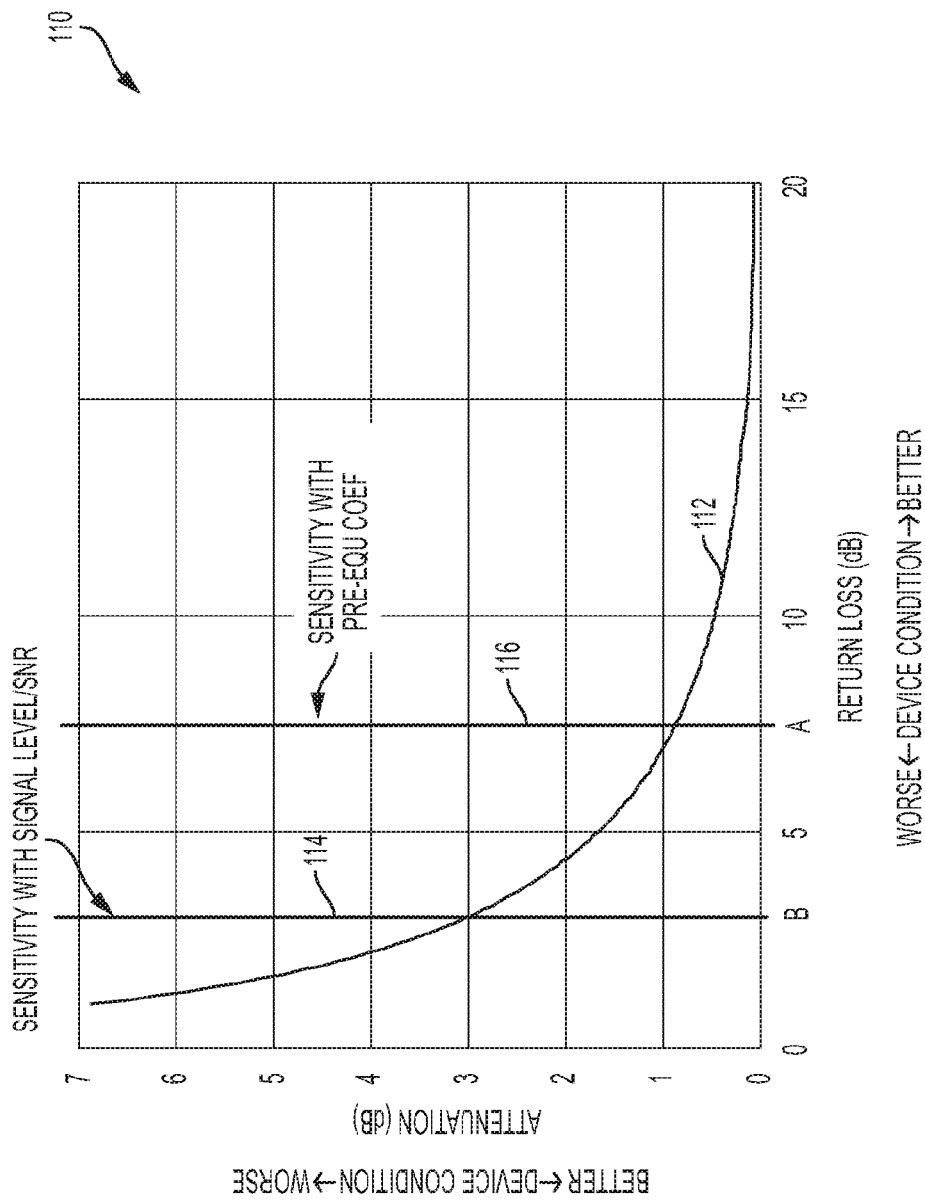
FIG. 6 is a simplified diagram illustrating yet other example details of embodiments of the communication system.

Turning to FIG. 6, FIG. 6 is a simplified diagram illustrating example details of a sensitivity comparison between SNR and pre-equalization coefficients in relation to fault detection using an attenuation to return-loss curve 110. The decision to choose a particular metric for fault signature identification may rely on availability of the metric, its objective nature, and its sensitivity. For example, while it may be desirable to leverage as many metrics as possible, PSM algorithm 40 may be built on metrics that are available currently (e.g., as of the time of analysis) and available from most of CMs 16, if not all. The selection of the metric may be objective, that is, not subject to change by CMTS 14 or HFC dependent (e.g., dependent on topology or network updates in cable network 12, etc.). Further, to enable PSM algorithm 40 to detect fault signatures before the fault escalates and affects customer service, the selected metric should have relatively high sensitivity to faults. In an example embodiment, PSM algorithm 40 uses pre-equalization coefficients as primary metrics, and FEC statistics, signal level and MER as secondary metrics for fault signature identification.

In a general sense, PER is far more sensitive for fault detection than MER. FEC statistics may be also used as a metric. Advantages of using FEC statistics include: (1) FEC statistics is more sensitive than MER (noise) for fault signature identification; (2) FEC has a well-defined boundary (say, <10-4). However, disadvantages include: (1) FEC statistics is not 100% objective, as it depends on the user profile (QAM order); and (2) FEC statistics is a long term average (no snap shot of performance). In some embodiments, the ratio of un-correctable CWs to the total received CWs may be used as the metrics for fault signature identification. FEC statistics depends on QAM order selection. If MER degradation exists, say of the order of 3 dB reduction, CMTS 14 may downgrade the QAM order by 1 level, which will neutralize the adverse effect of the reduced MER. Nevertheless, FEC can be used as the secondary metric.

From attenuation to return-loss curve 110, it may be concluded that pre-equalization coefficients are more sensitive for fault detection than signal level, assuming that fault detection with signal level/SNR uses a 3 dB threshold. Taps with −25 dB can be readily detected (e.g., 25 dB may correspond to 7.5 dB return loss at each end, and extra 10 dB cable loss in between) using pre-equalization coefficients, whereas the same is not possible with signal level or SNR.

In a general sense, taps in the pre-equalization coefficients are static and self-referred (e.g., uses the main tap), and thus can be a good metric in terms of availability. Among all the performance metrics mentioned above, pre-equalization coefficients provide the most reliable and sensitive fault signature for purposes discussed herein. The taps of pre-equalization coefficients can indicate faults (and location of the faults when combined with additional information) before they escalate and affect network performances. Moreover, the pre-equalization coefficients may be suitably retrieved from various components of the cable network using existing mechanisms (e.g., from periodic polls of coefficient values and other relevant PHY metrics).

Figure 7:
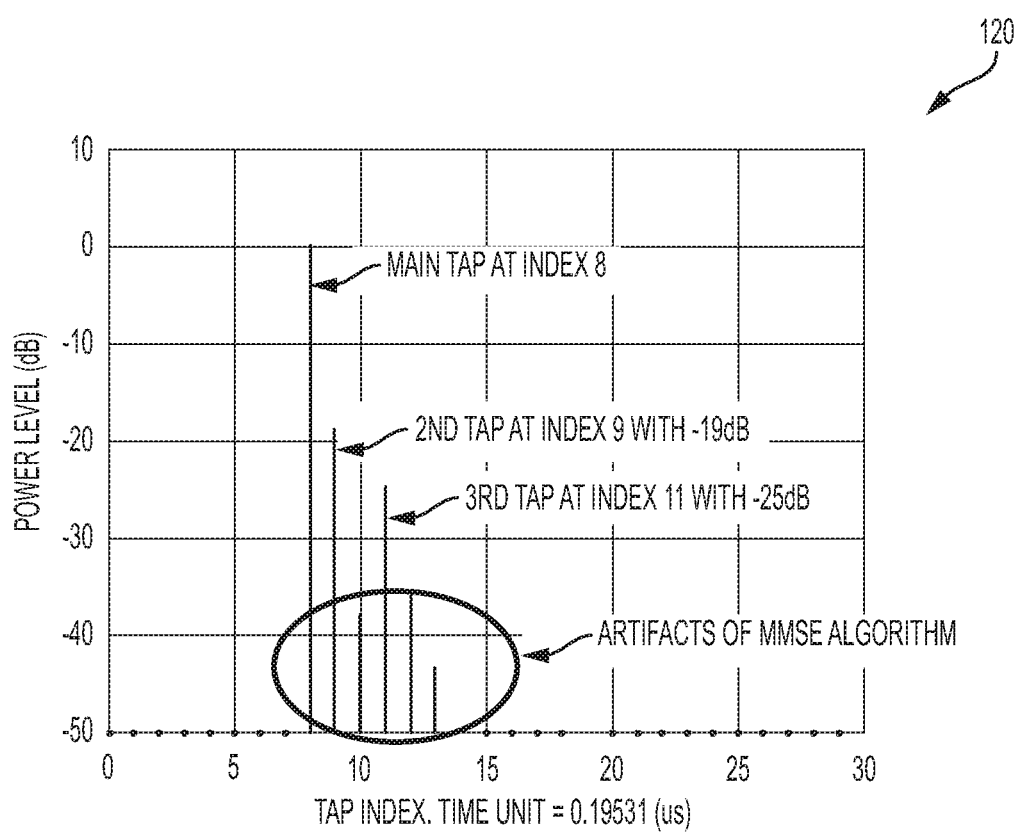
FIG. 7 is a simplified diagram illustrating yet other example details of embodiments of the communication system.

Turning to FIG. 7, FIG. 7 is a simplified diagram illustrating example details of graph 120 showing signal power levels as a function of tap index for a specific signal in the absence of group delay. The main tap, with maximum power, occurs at tap index 8, followed by the second tap at index 9 with approximately 19 dB attenuation, followed by the third tap at index 11 with approximately 25 dB attenuation. Further attenuation or taps may not be detectable using the algorithms disclosed herein, as they could be artefacts of calculations, approximations, modeling and other mathematical analysis techniques used by signal fault signature identifier 24.

Figure 8:
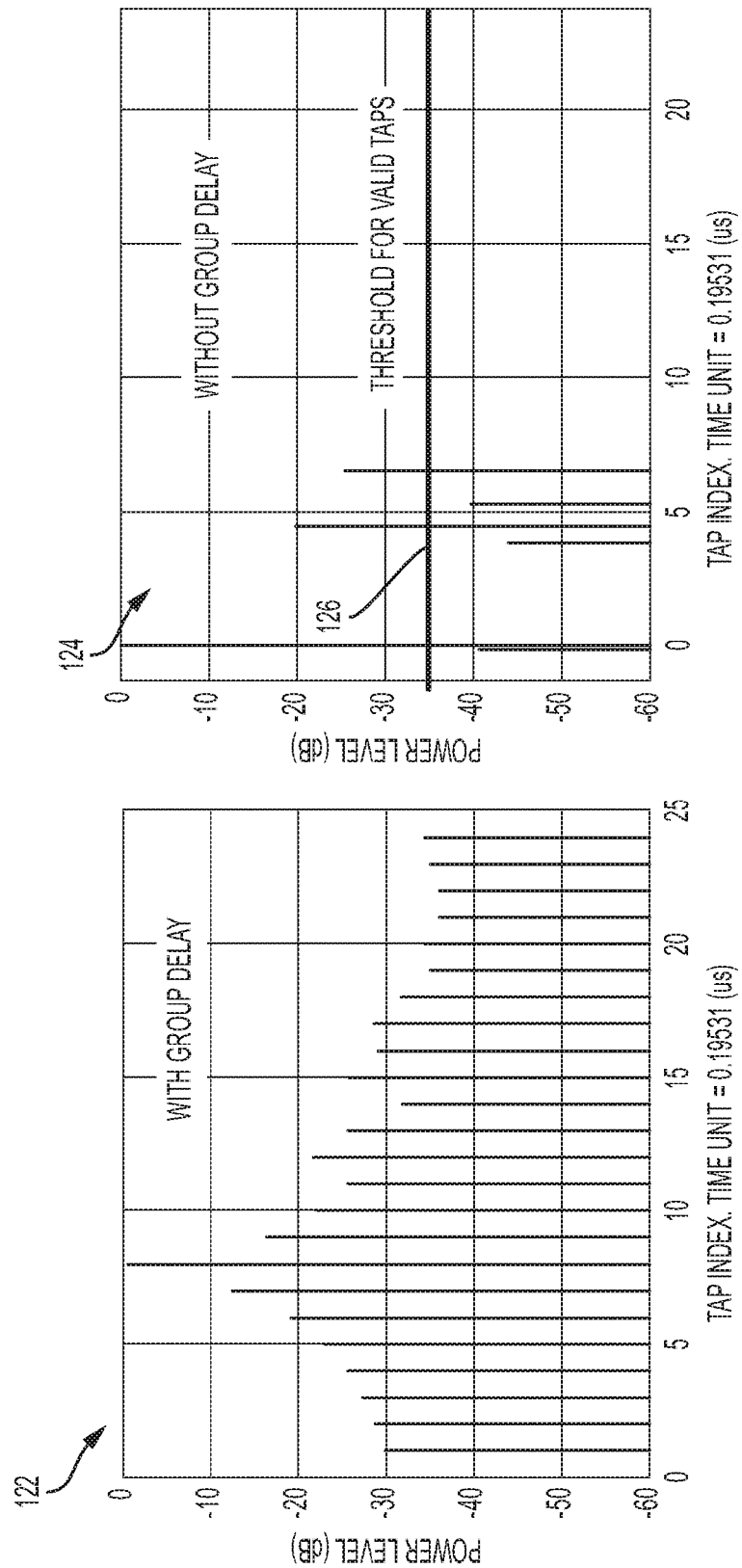
FIG. 8 is a simplified diagram illustrating yet other example details of embodiments of the communication system.

Turning to FIG. 8, FIG. 8 is a simplified diagram illustrating example details showing the effect of group delay through graphs 122 and 124 of signal power levels as a function of tap index for a specific signal. An example PSM algorithm for fault signature is used for tap detection from the channel response. The channel response is derived from the pre-equalization coefficients with the effect of group delays removed through a DSP algorithm. After the effect of group delays is removed, the taps can be detected reliably (note): Magnitude: −25 dB below the main tap; Time: 20 ns accuracy, resulting in 10 ft accuracy. The taps in the channel response directly link to the echoes of HFC. The tap timing can be used to locate the fault location.

In the presence of group delays, as indicated by graph 122, echoes from faults are swamped by side taps of the main taps, such that it is not possible to differentiate group delay from echoes caused by faults. In the example shown (based on simulations), taps with attenuation of 10 dB can be from group delays rather than faults. Moreover, group delay tends to smear and smooth the taps, resulting in failed taps detections and poor tap locations. Group delay is normal, and cannot be removed from cable network 12. To make the pre-equalization coefficients useful, the effect of the group delays should be removed.

On the other hand, graph 124 indicates distinctive taps from reflections when the effect of group delay is removed. A threshold 126 for valid taps may be compared against the distinctive taps of graph 124 to determine anomalies. For example, any power level greater than threshold 126 indicates a fault; thus taps 3 and 5 to the right of the main tap at 0 may be indicative of faults in cable network 12. Removing group delay effects can thereby improve accuracy of fault prediction.

Figure 9:
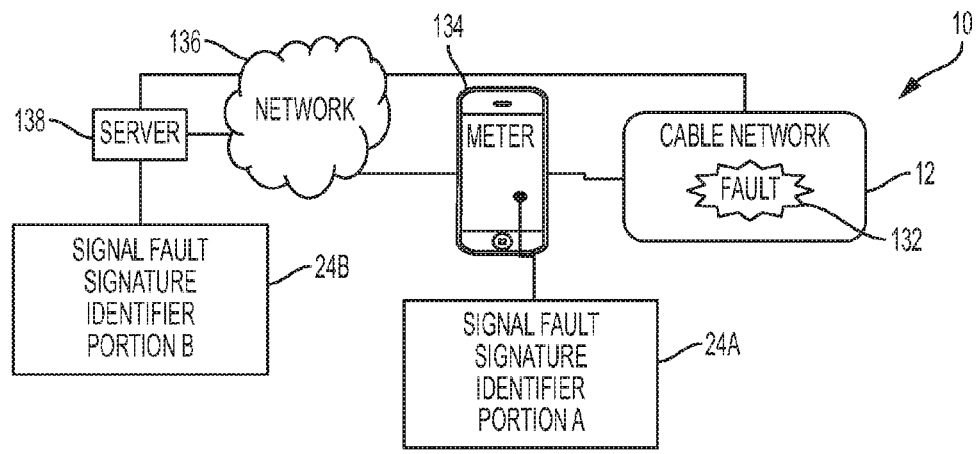
FIG. 9 is a simplified block diagram illustrating yet other example details of embodiments of the communication system.

Turning to FIG. 9, FIG. 9 is a simplified diagram illustrating example details according to an embodiment of communication system 10. Cable network 12 includes a fault 132, for example, caused by a malfunctioning device (including cables) that presents unwanted signal reflections. A meter 134 is connected (e.g., by a field technician, network operator, etc.) to cable network 12. Meter 134 comprises a wireless device, including a wireless phone configured with a special purpose application for performing the operations described herein. In an example embodiment, meter 134 is configured with a portion of signal fault signature identifier 24, for example, 24A comprising portion A. In some embodiments, portion A, 24), includes, in addition to processor 80 and memory element 82, phase domain echo searcher 84, group delay calculator 92 and fault identifier 104. Meter 134 is connected over a network 136, for example, a wireless network, to a server 138, which is configured with the remaining portion B of signal fault signature identifier 24, namely 24B. In many embodiments, portion B, 24B, includes, in addition to processor 80 and memory element 82, equalizer unit 74 and thresholds 102. Cable network 12 may be connected separately to server 138, for example, over network 136.

During operation, data from cable network 12 is retrieved and stored in server 138. The data may include signals, network updates, pre-equalization coefficients, thresholds, etc. Pre-equalization coefficients 76 are obtained and stored at server 138, in one embodiment, by periodic polling of cable network 12. A field technician connects meter 134 to cable network 12, for example, inserting it into a cable, or to an amplifier, etc. In some embodiments, meter 134 receives signal 70 from cable network 12; meter 134 sends signal 70 over network 136 to server 138. In other embodiments, signal 70 is received directly at server 138 from cable network 12. Signal fault signature identifier portion 24B calculates channel response 78 from signal 70 and provides channel response 78 to signal fault signature identifier portion 24A executing in meter 134. Signal fault signature identifier portion 24A computes fault signature 106, if any, and conveys it to server 138. In some embodiments, fault signature 106 may trigger additional functionalities, for example, fault locationing or fault classification algorithms, in meter 134 and/or server 138.

Figure 10:
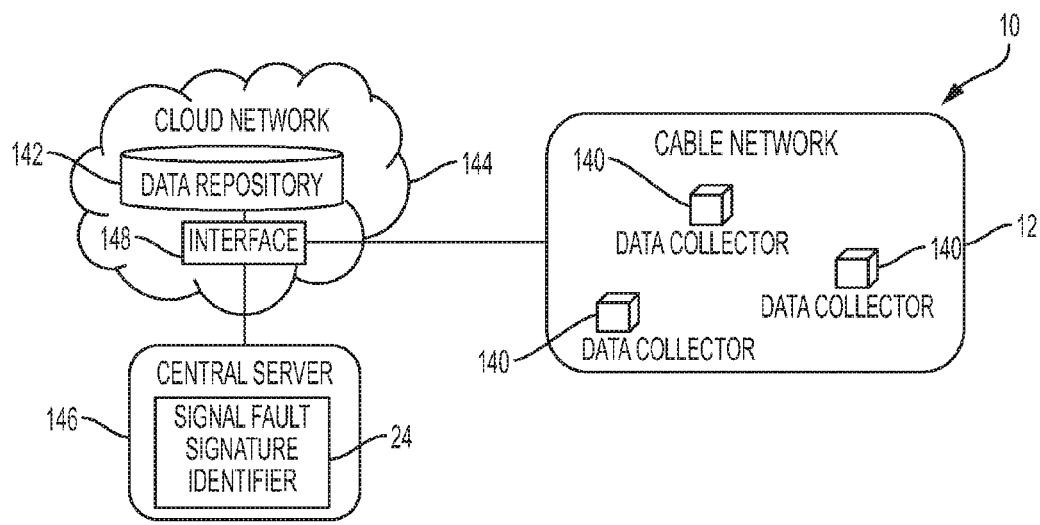
FIG. 10 is a simplified block diagram illustrating yet other example details of embodiments of the communication system.

Turning to FIG. 10, FIG. 10 is a simplified diagram illustrating example details according to an embodiment of communication system 10. In various embodiments, PSM algorithms 40 may be implemented using one or more data collector 140 deployed in cable network 12, a data repository 142 deployed in a cloud network 144 and a central server 146 in communication with data repository 142 over interface 148 in cloud network 144. Data collector 140 (and associated software to enable functionalities as described herein) may be located at a main network location, or deployed in several locations, within cable network 12. Data collector 140 makes queries, collects operations data (including signal 70), and forwards the collected data from network devices in cable network 12 to data repository 142 over interface 148. For example, pre-equalization coefficients 76 are obtained, in one embodiment, by periodic polling of cable network 12 by one or more data collector 140.

Data repository 142 provides long-term storage of historical data from data collector 140, network design data and services data. In an example embodiment, data repository 142 comprises a relational database capable of storing multiple terabytes of data and rapidly accessing the data in response to requests from PSM applications executing at central server 148 and/or data collector 140. Data repository 142 links to data collector 140 with a short-term data buffer that enables fast, real-time inquiries of cable network 12 to determine the current status of one or more network elements therein.

Interface 148 couples with the network's business support system/operations support systems (BSS/OSS) to obtain periodic updates on customer services, addresses and information attributes of network elements, including terminal devices 16, amplifiers 18, etc. at each location (such as type, model number, serial number, IP address, etc.), in addition to information from the operator's network design data base on the "as-built" attributes of cable network 12 (including topology of node, amplifier, tap locations and signal levels at each location).

In various embodiments, PSM algorithms 40 execute on central server 148 in signal fault signature identifier 24. Note that the term "central" refers to a logical center rather than a geographical center. In other words, central server 148 may be operated in a centralized manner, for example, with PSM algorithms 40 consolidated and executed under a single application (e.g., software) umbrella. In some embodiments, central server 148 may be operated by an entity independent of cloud network 144 and cable network 12, and communicating with data repository 142 irrespective of its actual geographical location relative to cloud network 144 or cable network 12. In some embodiments, central server 148, data repository 142 and cable network 12 may be controlled and operated by the same organization.

Central server 148 includes a processor (e.g., integrated circuit) and a memory element storing PSM algorithms 40 associated with signal fault signature identifier 24. In some embodiments the processor may itself be physically composed of distributed processors rather than a single processor. In various embodiments, execution of PSM algorithms 40 may be triggered manually (e.g., by a network operator). In other embodiments, PSM algorithms 40 may execute automatically substantially continually. In yet other embodiments, execution of PSM algorithms 40 may be triggered by specific types of data, for example, signal levels falling below a pre-determined threshold.

In a general sense, PSM algorithm 40 examines recent network data (e.g., captured RF metric 48) and compares it to expected values (e.g., thresholds 63, 65, 67, 69, 126). Authorized users can view the network topology and status at any time. When one or more variations is discovered, PSM algorithm 40 examines related data, logically determines the location and cause of the change, and recommends corrective action. For example, signal fault signature identifier 24 outputs fault signature 106, indicating a fault in cable network 12. In some embodiments, the calculated, recommended and corrective information is graphically displayed including the location of the problem, the customer locations (if any) affected by the problem and the underlying data triggering the recommendation. A user, such as a field technician, can drill down on information, including current values, thresholds and historical trend line value for each identified fault signature 106 (and other parameters). In some embodiments, the information is presented on a suitable device, for example, meter 134, via a web-based browser supporting HTML5 and Java, or another appropriate platform.

Figure 11:
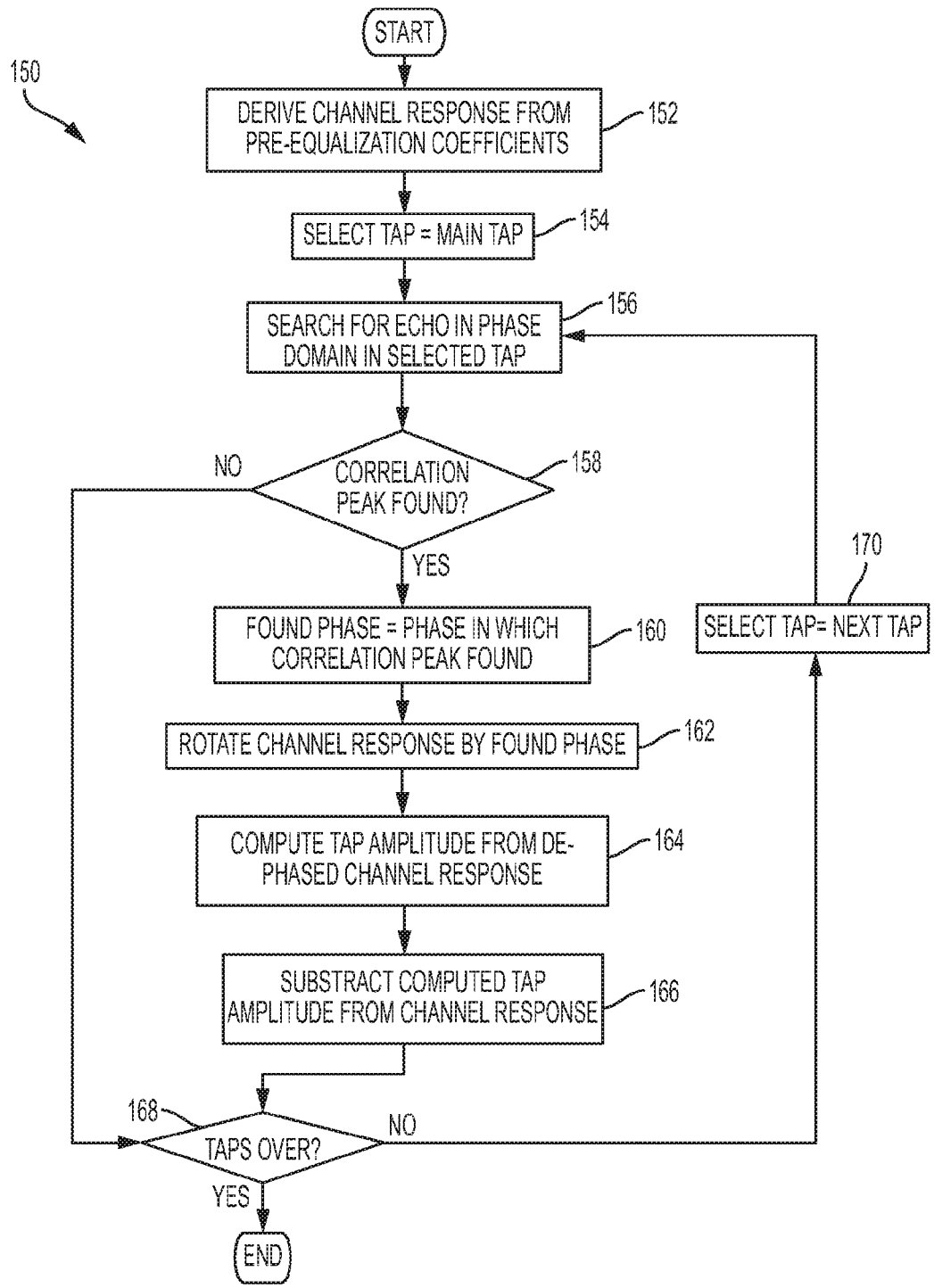
FIG. 11 is a simplified flow diagram illustrating example operations that may be associated with embodiments of the communication system.

Turning to FIG. 11, FIG. 11 is a simplified flow diagram illustrating example operations 150 that may be associated with embodiments of signal fault signature identifier 24 of communication system 10. At 152, channel response derivator 74 derives channel response 78 from pre-equalization coefficients 76 (which may be derived from multi-tone signal 70). At 154, the first iteration begins by selecting the main tap (e.g., tap index 8) for further analysis. At 156, phase domain echo searcher 84 searches for an echo in phase domain for the selected tap. At 158, a determination is made whether a correlation peak is found. If a correlation peak is found, at 160, the phase corresponding to the correlation peak is set to found phase 90. At 162, channel response 78 is rotated by found phase 90 and de-phased channel response is calculated. At 164, the tap amplitude is determined from the de-phased channel response. At 166, the computed tap amplitude is subtracted from the channel response to remove group delay. At 168, a determination is made whether all relevant taps have been considered. If not, the operations proceed to 170, at which the selected tap is set to the next tap. The operations continue to 156, and proceed thereafter. Turning back to 158, if no correlation peak is found for the selected tap, the operations step to 168, and proceed thereafter. At 168, if all the relevant taps have been considered, the operations end.

Turning to FIG. 12, FIG. 12 is a simplified diagram illustrating example algorithm 170 that may be associated with embodiments of signal fault signature identifier 24 of communication system 10. Initially, algorithm variables are set as suitable (e.g., desired, appropriate, relevant, etc.) values. Further, iterations are performed until a desired convergence (e.g., error value, or number of iterations, etc.) is obtained. Note that the analysis is performed on discretized (e.g., digitized) signal samples of signal 70. In some embodiments, the captured signal samples may be subject to windowing to reduce Gibbs phenomenon. Effects of performing an FFT over a non-integer number of cycles can be reduced using windowing. Windowing reduces the amplitude of the discontinuities at the boundaries of each finite sequence of the sample. Windowing consists of multiplying the time record by a finite-length window with an amplitude that varies smoothly and gradually toward zero at the edges. This results in a continuous waveform without sharp transitions.

Analysis of channel response 78 is performed in the phase domain. For example, an array of possible phase shifts is computed. Channel response 78 is phase shifted according to the array. IFFT is applied to the phase shifted channel response. A correlation peak is found by comparing the signals with each other. Phase 90 corresponding to the correlation peak is found. Channel response 78 is rotated by phase 90, and the tap amplitude computed from the dephased channel response, thereby removing the effect of group delay.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Furthermore, the words "optimize," "optimization," and related terms are terms of art that refer to improvements in speed and/or efficiency of a specified outcome and do not purport to indicate that a process for achieving the specified outcome has achieved, or is capable of achieving, an "optimal" or perfectly speedy/perfectly efficient state.

In example implementations, at least some portions of the activities outlined herein may be implemented in software in, for example, signal fault signature identifier 24. In some embodiments, one or more of these features may be implemented in hardware, provided external to these elements, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Furthermore, signal fault signature identifier 24 described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that a single processor and a single memory element are responsible for certain activities. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory element 82) can store data used for the operations described herein. This includes the memory element being able to store instructions (e.g., software, logic, code, etc.) in non-transitory media, such that the instructions are executed to carry out the activities described in this Specification. A processor can execute any type of instructions associated with the data to achieve the operations detailed herein in this Specification. In one example, processors (e.g., processor 80) could transform an element or an article (e.g., data, or electrical signals) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. The information being tracked, sent, received, or stored in communication system 10 could be provided in any database, register, table, cache, queue, control list, or storage structure, based on particular needs and implementations, all of which could be referenced in any suitable timeframe. Any of the memory items discussed herein should be construed as being encompassed within the broad term 'memory element.' Similarly, any of the potential processing elements, modules, and machines described in this Specification should be construed as being encompassed within the broad term 'processor.'

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to particular communication exchanges involving certain network access and protocols, communication system 10 may be applicable to other exchanges or routing protocols. Moreover, although communication system 10 has been illustrated with reference to particular elements and operations that facilitate the communication process, these elements, and operations may be replaced by any suitable architecture or process that achieves the intended functionality of communication system 10.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. An apparatus, comprising:
   a phase domain echo searcher;
   a memory element for storing data;
   a processor operable to execute instructions associated with the data, wherein the processor and the memory element cooperate, such that the apparatus is configured for:
      searching in phase domain for an echo in a channel response characterizing a channel in a cable network, wherein the channel facilitates communication of a multi-tone signal in the cable network;
      identifying a phase in which the echo is found;
      calculating a tap amplitude corresponding to the identified phase, wherein the calculated tap amplitude is indicative of group delay in the channel;
      correcting for the group delay, comprising subtracting the calculated tap amplitude from the channel response to obtain a corrected signal; and
      identifying a fault signature when amplitude of the corrected signal is greater than a threshold, wherein the identified fault signature triggers operational maintenance of the cable network.

2. The apparatus of claim 1, further comprising a channel response derivator configured for deriving the channel response from pre-equalization coefficients, wherein the pre-equalization coefficients include effects of at least the group delay in the channel.

3. The apparatus of claim 2, wherein the pre-equalization coefficients are obtained by periodic polling of the cable network.

4. The apparatus of claim 2, wherein the pre-equalization coefficients are stored in the apparatus prior to deriving the channel response.

5. The apparatus of claim 2, wherein the pre-equalization coefficients are stored in a cloud network, wherein the apparatus is located in a central server remote from the cable network and the cloud network, wherein the pre-equalization coefficients are retrieved from the cloud network prior to deriving the channel response at the apparatus in the central server.

6. The apparatus of claim 1, wherein calculating the tap amplitude corresponding to the identified phase comprises:
rotating the derived channel response by the identified phase; and
determining tap amplitude of the rotated channel response.

7. The apparatus of claim 1, wherein searching in phase domain comprises:
computing an array of possible phase shifts; and
phase-shifting the channel response according to the computed array.

8. The apparatus of claim 7, wherein identifying the phase comprises:
applying Inverse Fast Fourier Transform (IFFT) to the phase shifted channel response;
finding a correlation peak based on the IFFT; and
identifying the phase corresponding to the correlation peak.

9. The apparatus of claim 7, wherein samples of the multi-tone signal are stored in a database and retrieved therefrom by the apparatus for computing pre-equalization coefficients.

10. The apparatus of claim 7, wherein the multi-tone signal is received at the apparatus directly from the cable network.

11. A method executed at an integrated circuit, the method comprising:
searching in phase domain for an echo in a channel response characterizing a channel in a cable network, wherein the channel facilitates communication of a multi-tone signal in the cable network;
identifying a phase in which the echo is found;
calculating a tap amplitude corresponding to the identified phase, wherein the calculated tap amplitude is indicative of group delay in the channel;
correcting for the group delay, comprising subtracting the calculated tap amplitude from the channel response to calculate a corrected signal; and
identifying a fault signature when amplitude of the corrected signal is greater than a threshold, wherein the identified fault signature triggers operational maintenance of the cable network.

12. The method of claim 11, further comprising:
receiving the multi-tone signal from the cable network;
retrieving pre-equalization coefficients associated with the channel from the multi-tone signal;
deriving the channel response from the pre-equalization coefficients.

13. The method of claim 11, wherein calculating the tap amplitude corresponding to the identified phase comprises:
rotating the derived channel response by the identified phase; and
determining tap amplitude of the rotated channel response.

14. The method of claim 11, wherein searching in phase domain comprises:
computing an array of possible phase shifts; and
phase-shifting the channel response according to the computed array.

15. The method of claim 11, wherein identifying the phase comprises:
applying IFFT to the phase shifted channel response;
finding a correlation peak based on the IFFT; and
identifying the phase corresponding to the correlation peak.

16. Non-transitory tangible computer-readable media that includes instructions for execution, which when executed by an integrated circuit, is operable to perform operations comprising:
searching in phase domain for an echo in a channel response characterizing a channel in a cable network, wherein the channel facilitates communication of a multi-tone signal in the cable network;
identifying a phase in which the echo is found;
calculating a tap amplitude corresponding to the identified phase, wherein the calculated tap amplitude is indicative of group delay in the channel;
correcting for the group delay, comprising subtracting the calculated tap amplitude from the channel response to calculate a corrected signal; and
identifying a fault signature when amplitude of the corrected signal is greater than a threshold, wherein the identified fault signature triggers operational maintenance of the cable network.

17. The media of claim 16, wherein the operations further comprise:
receiving the multi-tone signal from the cable network;
retrieving pre-equalization coefficients associated with the channel from the multi-tone signal;
deriving the channel response from the pre-equalization coefficients.

18. The media of claim 16, wherein calculating the tap amplitude corresponding to the identified phase comprises:
rotating the derived channel response by the identified phase; and
determining tap amplitude of the rotated channel response.

19. The media of claim 16, wherein searching in phase domain comprises:
computing an array of possible phase shifts; and
phase-shifting the channel response according to the computed array.

20. The media of claim 16, wherein identifying the phase comprises:
applying IFFT to the phase shifted channel response;
finding a correlation peak based on the IFFT; and
identifying the phase corresponding to the correlation peak.

* * * * *